United States Patent
Chu et al.

(10) Patent No.: US 9,006,699 B2
(45) Date of Patent: Apr. 14, 2015

(54) RESISTIVE RANDOM ACCESS MEMORY USING AMORPHOUS METALLIC GLASS OXIDE AS A STORAGE MEDIUM

(71) Applicant: National Taiwan University of Science and Technology, Taipei (TW)

(72) Inventors: Jinn Chu, Taipei (TW); Berhanu Tulu Kacha, Taipei (TW); Wen-Zhi Chang, Taipei (TW)

(73) Assignee: National Taiwan University of Science and Technology (TW)

( * ) Notice: Subject to any disclaimer, the term of this patent is extended or adjusted under 35 U.S.C. 154(b) by 109 days.

(21) Appl. No.: 13/850,860

(22) Filed: Mar. 26, 2013

(65) Prior Publication Data
US 2014/0291600 A1    Oct. 2, 2014

(51) Int. Cl.
*H01L 45/00*    (2006.01)

(52) U.S. Cl.
CPC .............. *H01L 45/146* (2013.01); *H01L 45/04* (2013.01); *H01L 45/1233* (2013.01); *H01L 45/1625* (2013.01)

(58) Field of Classification Search
CPC .. H01L 45/14; H01L 45/147; G11C 13/0004; G11C 13/0007
USPC ............................ 257/2–4, E45.003; 365/148
See application file for complete search history.

(56) References Cited

U.S. PATENT DOCUMENTS

| | | | | |
|---|---|---|---|---|
| 8,766,233 B2* | 7/2014 | Sakotsubo et al. | ................. | 257/4 |
| 2010/0259966 A1* | 10/2010 | Kanzawa et al. | ............. | 365/148 |
| 2010/0314602 A1* | 12/2010 | Takano et al. | ..................... | 257/4 |
| 2012/0015506 A1* | 1/2012 | Jo et al. | ........................ | 438/482 |

FOREIGN PATENT DOCUMENTS

WO    WO 2011043448 A1 *    4/2011

OTHER PUBLICATIONS

Chu et al. "Thin film metallic glasses: Unique properties and potential applications", Apr. 9, 2012 Thin Solid Films 520 (2012) 5097-5122.
Tulu et al. "Resistive Switching Characteristics of (ZrCuAlNi)Ox—Based Memory Device", Nov. 23, 2012.

* cited by examiner

*Primary Examiner* — Allison P Bernstein

(57) ABSTRACT

The present invention relates to a resistive random access memory using amorphous metallic glass oxide as a storage medium, comprising a substrate, an insulation layer, a first electrode layer, a resistive memory layer, and a second electrode layer. In the present invention, an amorphous metallic glass oxide layer is mainly used as the resistive memory layer of the resistive random access memory. Therefore, the resistive random access memory with storage medium of amorphous metallic glass oxide thin film having advantages of low operation voltage, low power consumption, and high set/reset resistance ratio are provided without using any thermal annealing processes or forming processes.

6 Claims, 5 Drawing Sheets

RESISTIVE RANDOM ACCESS MEMORY USING AMORPHOUS METALLIC GLASS OXIDE AS A STORAGE MEDIUM

BACKGROUND OF THE INVENTION

1. Technical Field

The present invention relates to a resistive random access memory, and more particularly, to a resistive random access memory using amorphous metallic glass oxide as a storage medium.

2. Description of Related Art

With the evolution of the times, the development of technologies has a great progress. In particular, the digital electronic products are invented and widely used in human life. When using the electronic products, the electronic documents and digital data processed by the electronic products need to be stored in memories for caching or accessing. Generally, memories are divided into volatile memories and non-volatile memories, in which the new-generation non-volatile memories consist of ferroelectric random access memory (FeRAM), magnetoresistive random access memory (MRAM), phase-change random access memory (PRAM), and resistive random access memory (RRAM). In application, the RRAM includes advantages of low operation voltage, low power consumption, fast read speed, simple structure, and compatibility with existing semiconductor processing, so that the resistive random access memory is widely studied and evaluated.

However, it is known that they have some drawbacks and shortcomings due to the material limitation on their resistive memory layer. The drawbacks are:

1. The conventional RRAM having resistance conversion characteristics must complete a metal filament forming and rupture procedure; however, the breakdown of the resistive memory layer may occur in the RRAM when a high voltage (electric filed) is applied to the RRAM.

2. Inheriting to above point 1, it would yield high power consumption when the high voltage is applied to the resistive random access memory for executing the metal filaments forming procedure. In addition, the high voltages applied may also cause breakdown (failure) of the device.

3. Generally, the RRAM needing to be further executed a thermal annealing process after the resistive random access memory is fabricated. For this reason, the thermal budget of the resistive random access memory becoming very high; moreover, such thermal annealing being one of possible causes that could lead to the device failure.

4. In some cases, the RRAM requiring a forming process in order to activate the resistance switch property. The forming process involving application of high electric field may also cause the failure of device.

Accordingly, in view of the conventional resistive random access memory still having shortcomings and drawbacks. The inventor of the present application has made great efforts to make inventive research thereon and eventually provided a resistive random access memory using amorphous metallic glass oxide as a storage medium.

BRIEF SUMMARY OF THE INVENTION

The primary objective of the present invention is to provide a resistive random access memory using amorphous metallic glass oxide as a storage medium, in which an amorphous metallic glass oxide layer is used as the resistive memory layer of the resistive random access memory. Therefore, the resistive random access memory with the storage medium of amorphous metallic glass oxide thin film having advantages of low operation voltage, low power consumption, and high set/reset resistance ratio are provided without using any thermal annealing processes or forming processes.

Accordingly, to achieve the above objectives of the present invention, the inventor proposes a resistive random access memory using amorphous metallic glass oxide as a storage medium, comprising: a substrate; an insulation layer, formed on the substrate; a first electrode layer, stably formed on the insulation layer through an adhesion-enhancing layer; a resistive memory layer, formed on the first electrode layer, wherein the resistive memory layer is an amorphous metallic glass oxide layer; and a second electrode layer, formed on the resistive memory layer.

BRIEF DESCRIPTION OF THE SEVERAL VIEWS OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE INVENTION

To depict more clearly a resistive random access memory using amorphous metallic glass oxide as a storage medium according to the present invention, embodiments of the present invention will be described in detail with reference to the attached drawings hereinafter.

Amorphous metals (also called metallic glasses) are now widely applied in optoelectronics, micro electro mechanicals (MEMs) and energy industries because having the excellent mechanical properties of high strength, high hardness, and well corrosion resistance. In amorphous metals, the best yield strength of zirconium-based amorphous metallic glasses can be 300 ksi, that is 2 or 3 times greater than those of stainless steels and titanium alloys. In addition, the zirconium-based bulk metallic glasses, the palladium-based bulk metallic glasses and the copper-based bulk metallic glasses can be manufactured to components applied in optoelectronics or MEMs using micro-nano imprinting technology.

Figure 1:
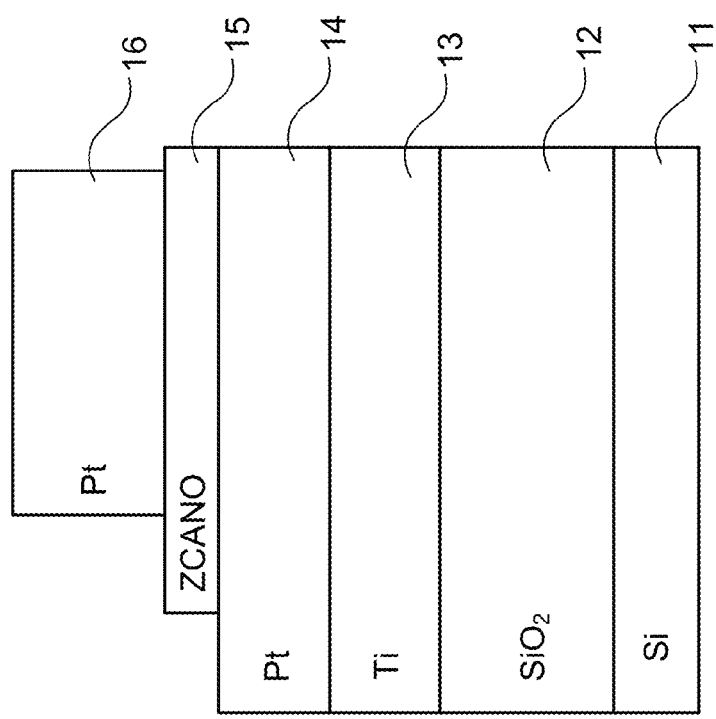
FIG. 1 is a schematic framework diagram of a resistive random access memory using amorphous metallic glass oxide as a storage medium according to the present invention.

The present invention, thin film amorphous metallic glass oxide, is the first to be used as a resistive memory material of a resistive random access memory, and that does further develop the electrical or electric application of the amorphous metallic glass oxide materials. Please refer to FIG. 1, which illustrates a schematic framework diagram of a resistive random access memory using amorphous metallic glass oxide as a storage medium according to the present invention. As shown in FIG. 1, the resistive random access memory 1 using amorphous metallic glass oxide as the storage medium (hereinafter called as resistive random access memory 1) includes: a substrate 11, an insulation layer 12, a first electrode layer 14, a resistive memory layer 15, and a second electrode layer 16. In the present invention, it uses a silicon-on-insulator (SOI) substrate for replacing the substrate 11 and the insulation layer 12, and the first electrode layer 14, the resistive memory layer 15 and the second electrode layer 16 are sequentially formed on the insulation layer 12 of the SOI substrate.

Continuously referring to FIG. 1, the first electrode layer 14 and the second electrode layer 16 are respectively be a bottom electrode and a top electrode of the resistive random access memory 1, and the manufacturing material of the first electrode layer 14 and the second electrode layer 16 can be platinum (Pt), gold (Au), ruthenium (Ru), palladium (Pd). Preferably, in the present invention, the manufacturing material of the first electrode layer 14 and the second electrode layer 16 is Pt. Particularly, in the present invention, an adhesion-enhancing layer 13 is formed between the first electrode layer 14 and the insulation layer 12, so as to make the first electrode layer 14 be stably formed on the insulation layer 12. In addition, the adhesion-enhancing layer 13 is titanium (Ti) layer.

In the resistive random access memory 1, the resistive memory layer 15 formed on the first electrode layer 14 is a thin film metallic glass oxide (TFMGO), and the thickness of the TFMGO is ranged from 8 nm to 50 nm. In the present invention, a zirconium-based amorphous metallic glass oxide layer of $(Zr_{53}Cu_{28}Al_{12}Ni_6)O_x$ (ZCANO) (i.e., the thin film metallic glass oxide layer (TFMGO)) is formed on the first electrode layer 14 by taking a zirconium-based amorphous metallic glass of $Zr_{53}Cu_{28}Al_{12}Ni_6$ as a sputtering target and using a radio frequency magnetron sputtering system to carry out the sputtering process under an environment having argon and oxygen gas. Herein, it must further explain that the ZCANO is not used for limiting the manufacturing material of resistive memory layer 15; however, in some exemplary embodiments of the resistive random access memory 1, the resistive memory layer 15 can also be a palladium-based metallic glass oxide layer, a copper-based metallic glass oxide layer, or any others metal-based metallic glass oxide layers. These metal-based metallic glass systems are in general widely used elsewhere for forming bulk metallic glasses.

Figure 2:
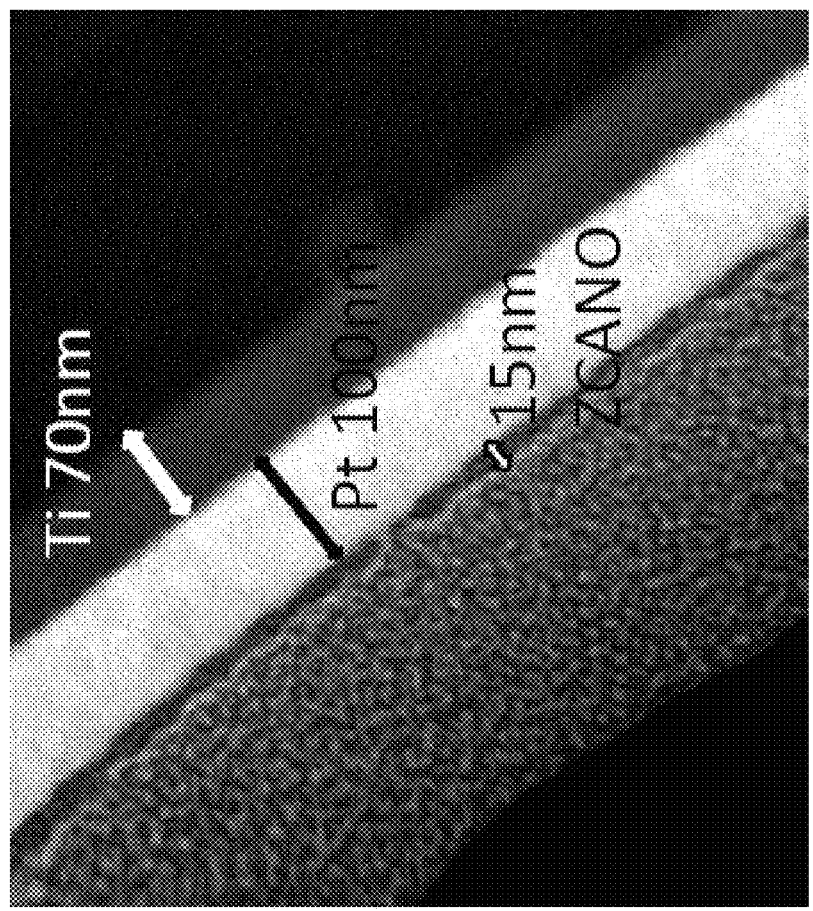
FIG. 2 is a transmission electron microscope (TEM) image of the resistive random access memory using amorphous metallic glass oxide as the storage medium.

Thus, through above descriptions, the frameworks and properties of the resistive random access memory 1 using amorphous metallic glass oxide as the storage medium of the present invention have been introduced completely and clearly. Next, in order to prove the practicability, repeatability and reliability of the resistive random access memory 1, a variety of experimental data will be presented as follows. Referring to FIG. 2, which reveals a transmission electron microscope (TEM) image of the resistive random access memory using amorphous metallic glass oxide as the storage medium. Moreover, please simultaneously refer to FIG. 3 and FIG. 4, which show a current-voltage curve plot and a cyclic resistance change plot of the resistive random access memory using amorphous metallic glass oxide as the storage medium.

Inheriting to above descriptions, as shown in FIG. 2, the resistive memory layer 15 (i.e., the ZCANO) formed on the first electrode layer 14 (i.e., Pt layer) has the even thickness of 15 nm, and there are no obvious drawbacks and vacancies in the ZCANO. Moreover, there is an excellent adhesion among the first electrode layer 14 (bottom electrode), the ZCANO layer and the second electrode layer 16 (top electrode).

Figure 3:
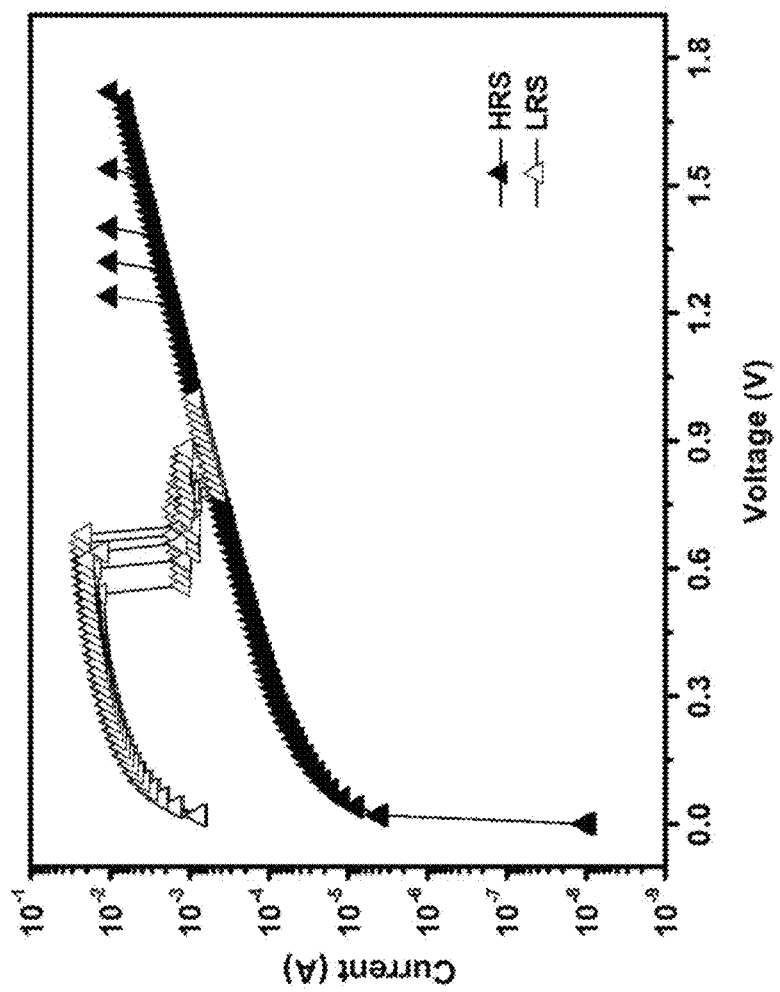
FIG. 3 is a current-voltage curve plot of the resistive random access memory using amorphous metallic glass oxide as the storage medium.

The current-voltage curve plot of FIG. 3 is obtained by electrically measuring the resistive random access memory 1 fabricated by the RF magnetron sputtering process, wherein the resistive random access memory 1 does not be further treated any thermal annealing processes or forming processes. Clearly, in the current-voltage curve plot, the measured current of the resistive random access memory 1 increases from a low current level to a high current level when the voltage applied to the first electrode 14 and the second electrode 16 is gradually increased from 0V to 1.8V. It means that the resistive random access memory 1 is converted from a high resistance state (HRS) to a low resistance state (LRS).

Figure 4:
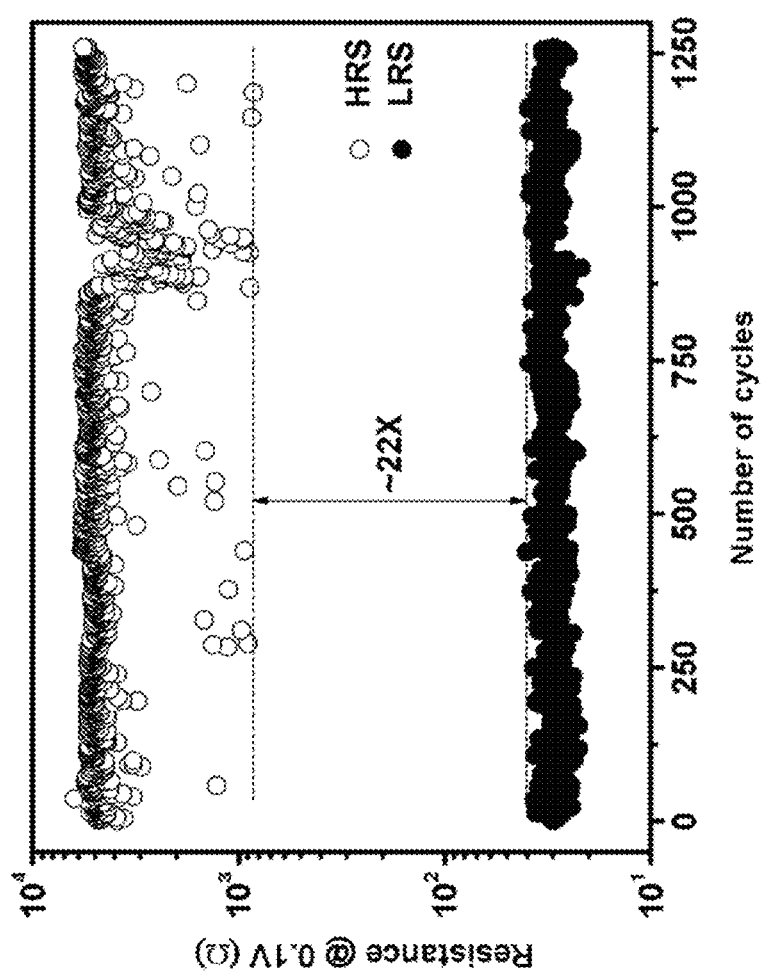
FIG. 4 is a cyclic resistance change plot of the resistive random access memory using amorphous metallic glass oxide as the storage medium.

Again referring to FIG. 3, when the voltage is applied to the first electrode 14 and the second electrode 16 once again and increased from 0V to 0.8V, the measured current of the resistive random access memory 1 decreases from the high current level to the low current level. It means that the resistive random access memory 1 is converted from the low resistance state (LRS) to the high resistance state (HRS). Therefore, the current-voltage curve plot of FIG. 3 has been proven that the resistive random access memory 1 using amorphous metallic glass oxide as the storage medium of the present invention performs a unipolar resistance switching behavior. In addition, as shown in FIG. 4, the cyclic resistance change plot further proves repeatability and reproducibility of the resistive random access memory 1 of the present invention between the high resistance state or the low resistance state. Moreover, the most important is that, when using the resistive random access memory 1 using amorphous metallic glass oxide as the storage medium of the present invention, the numeric value of a resistance ratio of the HRS and the LRS can be kept to at least 22 in each of cyclic resistance conversions.

Figure 5:
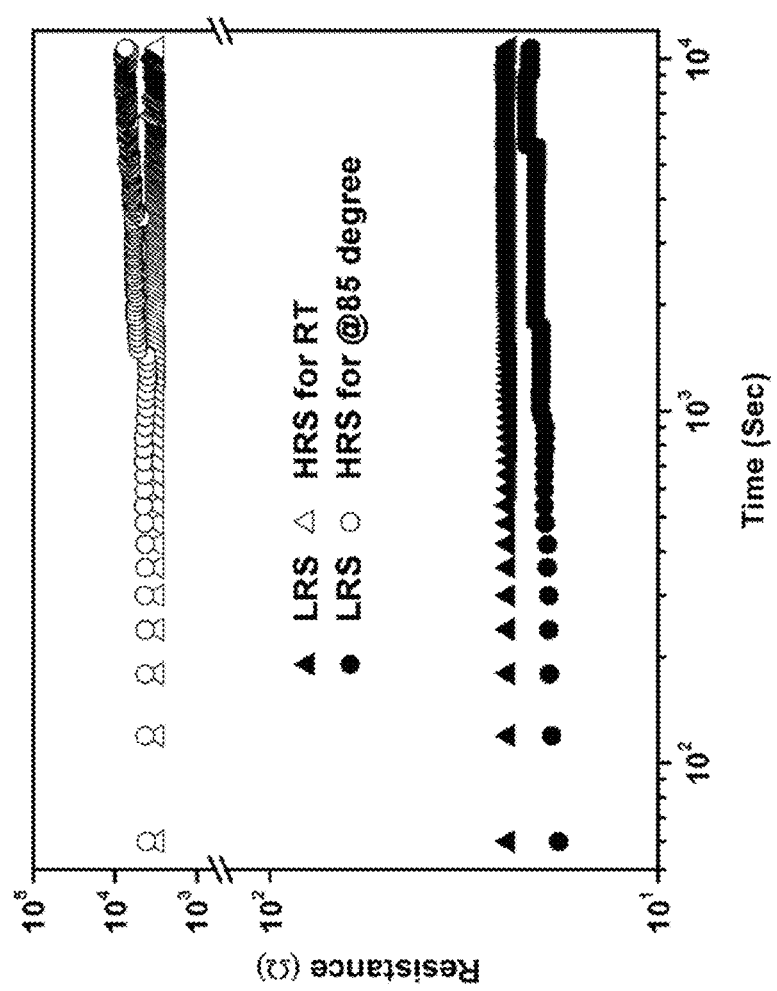
FIG. 5 is a time versus resistance value plot of the resistive random access memory using amorphous metallic glass oxide as the storage medium for up to $10^4$ seconds.

Please refer to FIG. 5, it shows a time versus resistance value plot of the resistive random access memory using amorphous metallic glass oxide as the storage medium for up to $10^4$ seconds. As shown in FIG. 5, after the resistive random access memory 1 is converted to the high resistance state (HRS), the resistive random access memory 1 can retain its high-resistance value during the course of measurement up to $10^4$ seconds under room temperature (RT) or high temperature (85° C.). Similarly, during the same period of measurement, the resistive random access memory 1 can retain its low-resistance value under room temperature (RT) or high temperature (85° C.) after it is converted to the low resistance state (LRS). Thus, the experimental result of data retention shown in FIG. 5 proves the excellent reliability of the resistive random access memory 1 using amorphous metallic glass oxide as the storage medium of the present invention.

Therefore, the above descriptions have been clearly and completely introduced the resistive random access memory using amorphous metallic glass oxide as the storage medium of the present invention. In summary, the present invention has the following advantages:

1. The resistive random access memory using amorphous metallic glass oxide as the storage medium provided by the present invention naturally includes the resistance conversion characteristics, without being further treated with any thermal annealing processes or forming processes.

2. Inheriting to above point 1, because the resistive random access memory using amorphous metallic glass oxide as the storage medium naturally includes the resistance conversion characteristics, it includes the advantages of low operation voltage and low power consumption. Besides, the breakdown of the resistive memory layer would not likely occur in this resistive random access memory.

3. Inheriting to above point 1, because the resistive random access memory using amorphous metallic glass oxide as the storage medium is fabricated by the RF magnetron sputtering process without using any thermal annealing process, the thermal budget of this resistive random access memory is much less than the thermal budget of the conventional resistive random access memories.

4. Moreover, by the experimental data, the resistive random access memory using amorphous metallic glass oxide as the storage medium can still perform a stably high resistance ratio (–22) after being repeatedly converted in a high resistance state and a low resistance state; and the data shows that the resistive random access memory includes an excellent repeatability.

5. Furthermore, based on the experimental data, after the resistive random access memory 1 is converted to the high resistance state/low resistance state, the resistive random access memory can retain its high-resistance/low-resistance value during the course of measurement up to $10^4$ seconds under room temperature (RT) or high temperature (85° C.); and the data shows that the resistive random access memory has an excellent reliability.

The above description is made on embodiments of the present invention. However, the embodiments are not intended to limit scope of the present invention, and all equivalent implementations or alterations within the spirit of the present invention still fall within the scope of the present invention.

We claim:

1. A resistive random access memory using amorphous metallic glass oxide as a storage medium, comprising:
    a substrate;
    an insulation layer formed on the substrate;
    a first electrode layer formed on the insulation layer through an adhesion-enhancing layer;
    a resistive memory layer formed on the first electrode layer, wherein the resistive memory layer is an amorphous metallic glass oxide layer; and
    a second electrode layer formed on the resistive memory layer;
    wherein the amorphous metallic glass oxide layer is an oxide of $Zr_{53}Cu_{28}Al_{12}Ni_6$.

2. The resistive random access memory using amorphous metallic glass oxide as the storage medium of claim 1, wherein the manufacturing material of the first electrode layer 14 is selected from the group consisting of platinum (Pt), gold (Au), ruthenium (Ru), palladium (Pd).

3. The resistive random access memory using amorphous metallic glass oxide as the storage medium of claim 1, wherein the manufacturing material of the second electrode layer 16 is selected from the group consisting of: platinum (Pt), gold (Au), ruthenium (Ru), palladium (Pd).

4. The resistive random access memory using amorphous metallic glass oxide as the storage medium of claim 1, wherein the thickness of the resistive memory layer is ranged from 8 nm to 50 nm.

5. The resistive random access memory using amorphous metallic glass oxide as the storage medium of claim 1, wherein the manufacturing material of the adhesion-enhancing layer is titanium (Ti).

6. The resistive random access memory using amorphous metallic glass oxide as the storage medium of claim 1, wherein the manufacturing material of the substrate is silicon (Si).

* * * * *